(12) United States Patent
Nazif et al.

(10) Patent No.: US 11,588,066 B2
(45) Date of Patent: Feb. 21, 2023

(54) TANDEM SOLAR CELLS HAVING A TOP OR BOTTOM METAL CHALCOGENIDE CELL

(71) Applicant: The Board of Trustees of the Leland Stanford Junior University, Stanford, CA (US)

(72) Inventors: Koosha Nassiri Nazif, Stanford, CA (US); Raisul Islam, San Jose, CA (US); Jin-Hong Park, Hwasung-si (KR); Krishna C. Saraswat, Saratoga, CA (US)

(73) Assignee: The Board of Trustees of the Leland Stanford Junior Univesity, Stanford, CA (US)

( * ) Notice: Subject to any disclaimer, the term of this patent is extended or adjusted under 35 U.S.C. 154(b) by 0 days.

(21) Appl. No.: 17/288,689

(22) PCT Filed: Nov. 5, 2019

(86) PCT No.: PCT/US2019/059849
§ 371 (c)(1),
(2) Date: Apr. 26, 2021

(87) PCT Pub. No.: WO2020/097066
PCT Pub. Date: May 14, 2020

(65) Prior Publication Data
US 2021/0359150 A1    Nov. 18, 2021

Related U.S. Application Data
(60) Provisional application No. 62/755,784, filed on Nov. 5, 2018.

(51) Int. Cl.
*H01L 31/0725* (2012.01)
*H01L 31/032* (2006.01)
*H01L 31/055* (2014.01)
*H01L 31/028* (2006.01)
(Continued)

(52) U.S. Cl.
CPC ........ *H01L 31/0725* (2013.01); *H01L 31/028* (2013.01); *H01L 31/0304* (2013.01);
(Continued)

(58) Field of Classification Search
CPC ............... H01L 31/0325; H01L 31/055; H01L 31/0687; H01L 31/07; H01L 31/072; H01L 31/0725; H01L 31/076
See application file for complete search history.

(56) References Cited

U.S. PATENT DOCUMENTS 4,867,801 A * 9/1989 Stanbery ............... H01L 31/078
                                                    136/249
9,640,391 B2   5/2017 Yang et al.
(Continued)

FOREIGN PATENT DOCUMENTS

WO    WO2019/145867    8/2019

OTHER PUBLICATIONS

Toshiki Akama, "Schottky solar cell using few-layered transition metal dichalcogenides toward large-scale fabrication of semitransparent and flexible power generator", Scientific Reports 7, Article No. 11967 (2017).
(Continued)

*Primary Examiner* — Golam Mowla
(74) *Attorney, Agent, or Firm* — Lumen Patent Firm

(57) ABSTRACT

Tandem solar cell configurations are provided where at least one of the cells is a metal chalcogenide cell. A four-terminal tandem solar cell configuration has two electrically independent solar cells stacked on each other. A two-terminal solar cell configuration has two electrically coupled solar cells (same current through both cells) stacked on each other. Carrier selective contacts can be used to make contact to the metal chalcogenide cell (s) to alleviate the troublesome Fermi level pinning issue. Carrier-selective contacts can also
(Continued)

remove the need to provide doping of the metal chalcogenide. Doping of the metal chalcogenide can be provided by charge transfer. These two ideas can be practiced independently or together in any combination.

12 Claims, 9 Drawing Sheets

(51) Int. Cl.
H01L 31/0304 (2006.01)
H01L 31/0687 (2012.01)
H01L 31/07 (2012.01)
H01L 31/072 (2012.01)

(52) U.S. Cl.
CPC ...... *H01L 31/0322* (2013.01); *H01L 31/0324* (2013.01); *H01L 31/0325* (2013.01); *H01L 31/055* (2013.01); *H01L 31/0687* (2013.01); *H01L 31/07* (2013.01); *H01L 31/072* (2013.01); *Y02E 10/544* (2013.01)

(56) References Cited

U.S. PATENT DOCUMENTS

| | | | |
|---|---|---|---|
| 2006/0112985 A1* | 6/2006 | Hantschel | H01L 31/1828 136/252 |
| 2010/0193018 A1* | 8/2010 | Feist | H01L 31/0725 136/255 |
| 2011/0017298 A1* | 1/2011 | Lee | H01L 31/043 438/95 |
| 2014/0110813 A1* | 4/2014 | Liang | H01L 31/0326 257/463 |
| 2015/0136214 A1 | 5/2015 | Islam | |
| 2016/0087233 A1 | 3/2016 | Guha | |
| 2017/0271622 A1 | 9/2017 | Chaudhari | |
| 2018/0151763 A1 | 5/2018 | Heo | |
| 2018/0248052 A1 | 8/2018 | Seok | |

OTHER PUBLICATIONS

Elshorbagy et al., "Efficient Light Management in a Monolithic Tandem Perovskite/Silicon Solar Cell by Using a Hybrid Metasurface", 2019, Nanomaterials v9.
Hao et al., "High-performance n-MoS2/i-SiO2/p-Si heterojunction solar cells", 2015, Nanoscale v7.
Islam et al., "Limitation of Optical Enhancement in Ultra-thin Solar Cells Imposed by Contact Selectivity", 2018, Scientific Reports 8:8863.
Nazif et al., "Towards high Voc, thin film, homojunction WS2 solar cells for energy harvesting applications", Sep. 2019, SPIE Optical Engineering + Applications, San Diego.

* cited by examiner

| Bulk/eV | Gap | Gap (exp) | IP | EA | CNL | Exp. IP |
|---|---|---|---|---|---|---|
| $MoS_2$ | 1.35 | 1.29 | 5.56 | 4.21 | 0.7 | 5.47 |
| $MoSe_2$ | 1.16 | 1.09 | 4.97 | 3.81 | 0.43 | |
| $MoTe_2$ | 1.01 | 0.93 | 4.79 | 3.78 | 0.33 | |
| $WS_2$ | 1.44 | 1.57 | 5.36 | 3.92 | 0.88 | |
| $WSe_2$ | 1.33 | 1.2 | 4.83 | 3.50 | 0.77 | 5.19 |
| $WTe_2$ | 1.07 | | 4.57 | 3.5 | 0.39 | |
| $HfS_2$ | 1.95 | 1.98 | 6.70 | 4.75 | 0.95 | 7.10 |
| $HfSe_2$ | 1.25 | 1.14 | 5.90 | 4.65 | 0.6 | |
| $ZrS_2$ | 1.8 | 1.78 | 6.75 | 4.95 | 0.85 | |
| $ZrSe_2$ | 1.12 | 1.18 | 5.97 | 4.85 | 0.56 | |
| $SnS_2$ | 2.0 | 2.18 | 7.3 | 5.3 | 1.33 | 7.14 |
| $SnSe_2$ | 1.3 | 1.03 | 6.3 | 5.0 | 0.87 | 6.21 |

TANDEM SOLAR CELLS HAVING A TOP OR BOTTOM METAL CHALCOGENIDE CELL

CROSS-REFERENCE TO RELATED APPLICATIONS

This application is a 371 of PCT application PCT/US2019/059849 filed Nov. 5, 2019. PCT application PCT/US2019/059849 claims the benefit of U.S. Provisional application 62/755,784 filed Nov. 5, 2018.

FIELD OF THE INVENTION

This invention relates to tandem solar cells.

BACKGROUND

Metal chalcogenides should be very attractive for solar cell applications because (i) these materials have high optical absorption exceeding that of III-V compound semiconductors in the solar spectrum and (ii) their bandgap varies from ~1 eV to 2 eV depending on composition and thickness (ultrathin single layer vs. bulk). Furthermore, these materials are already under intensive development for purely electronics applications, such as ultra-scaled transistors.

However, thus far it has been difficult to obtain good performance from metal chalcogenide solar cells. The main problems are difficulty in doping these materials, and difficulty making appropriate electrical contact to these materials. Accordingly, it would be an advance in the art to provide improved metal chalcogenide solar cells.

SUMMARY

In this work, tandem solar cell configurations (2-cell) are considered where at least one of the cells is a metal chalcogenide cell. In preferred embodiments, carrier selective contacts are used to make contact to at least the metal chalcogenide cell. Such contacts can alleviate the troublesome Fermi level pinning issue, and can also remove the need to provide doping of the metal chalcogenide. In other preferred embodiments, doping of the metal chalcogenide is provided by charge transfer. These two ideas can be practiced independently or together in any combination.

A four-terminal tandem solar cell configuration has two electrically independent solar cells stacked on each other. A two-terminal solar cell configuration has two electrically coupled solar cells stacked on each other. In the two-terminal configuration, the current must be the same in each cell, which substantially complicates the device design.

DETAILED DESCRIPTION

Section A describes four-terminal and two-terminal metal chalcogenide tandem solar cell device configurations. Section B describes carrier-selective contacts. Section C describes doping of metal chalcogenides by charge transfer. Section D provides some exemplary experimental results.

A) Four-Terminal and Two-Terminal Metal Chalcogenide Solar Cells

Figure 1:
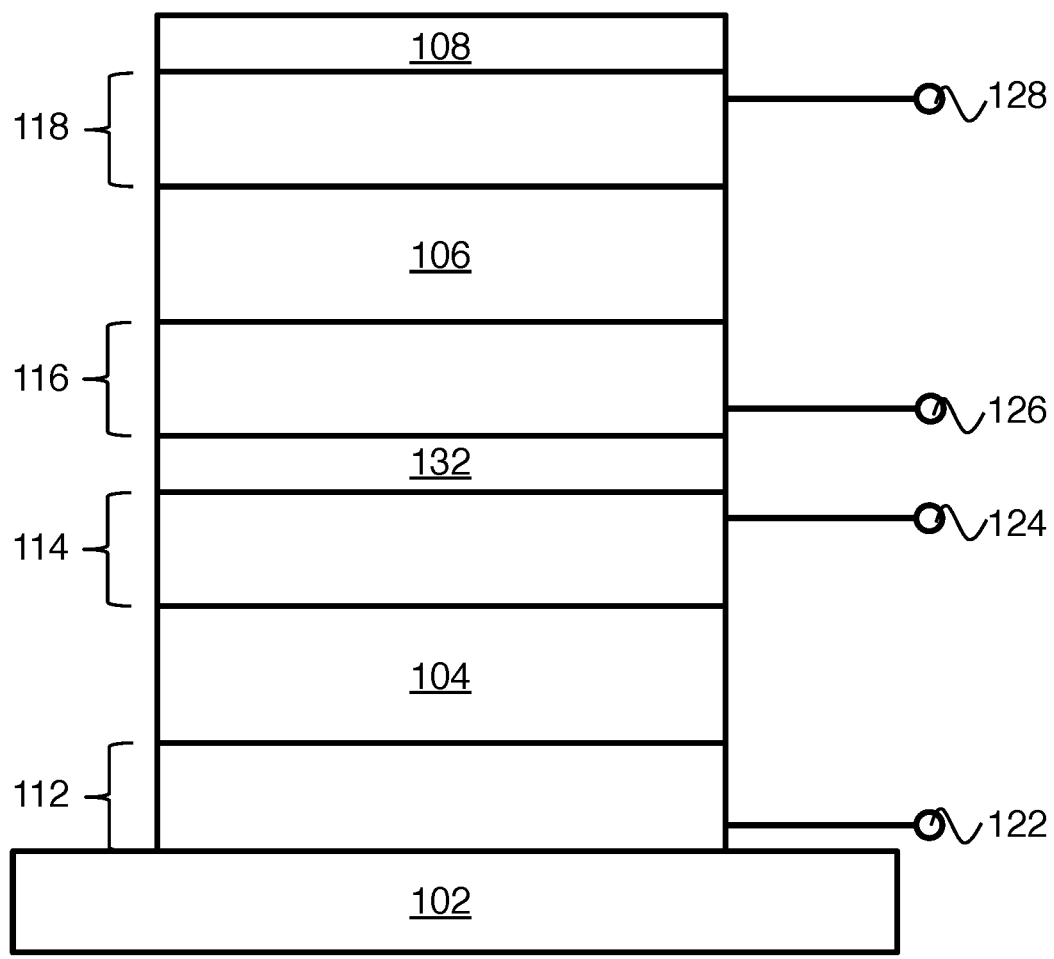
FIG. 1 shows a first embodiment of the invention.

FIG. 1 shows a first exemplary embodiment of the invention. This example includes a substrate 102, a first solar cell contact structure 112 disposed on substrate 102, a first solar cell active light absorber material 104 disposed on first solar cell contact structure 112 and having a first band gap E1, and a second solar cell contact structure 114 disposed on first solar cell active light absorber material 104. An insulator layer 132 is disposed on second solar cell contact structure 114. This example further includes a third solar cell contact structure 116 disposed on the insulator layer 132, a second solar cell active light absorber material 106 disposed on the third solar cell contact structure 116 and having a second band gap E2, and a fourth solar cell contact structure 118 disposed on the second solar cell active light absorber material 106. Preferably an anti-reflection coating 108 is disposed on the fourth solar cell contact structure 118. The second, third and fourth contact structures and the insulator layer (i.e., 114, 116, 118, 132) are each transparent to the solar spectrum. Here 'transparent to the solar spectrum' means transmission loss <40% averaged uniformly over wavelengths from 400 nm to 1000 nm.

At least one of the first and second solar cell active light absorber materials is a metal chalcogenide, and E2>E1 so that the top solar cell in the tandem structure has a larger bandgap than the bottom cell. Contact structures 112, 114, 116, 118 are electrically conductive structures, and are connected to terminals 122, 124, 126, 128, respectively. The resulting four-terminal structure is a vertical stack of two electrically independent solar cells.

Metal chalcogenides can have very attractive properties for solar cell applications. For example, bulk $ReS_2$ has a direct bandgap of about 1.5 eV, similar to that of GaAs, which is needed for proper light absorption beyond the cutoff wavelength of Si. It can be synthesized by CVD (chemical vapor deposition) method at temperatures around 550° C. making it amenable to low cost manufacturing. Furthermore, it is very stable in air, and hence reliable. Wide bandgap metal chalcogenides should be ideal to harvest the near UV part of the solar spectrum, but very little work has been done on the metal chalcogenide solar cells, primarily due to the difficulty in forming p-n homojunctions and finding proper light absorber and contact materials. Another possibility of interest is to have a GaAs top cell disposed over a metal chalcogenide bottom cell. This could be useful in space applications where efficiency is paramount and the high cost of GaAs is relatively unimportant.

Practice of the invention does not depend critically on specific materials used for the first and second solar cell active light absorber materials. Suitable materials for the first solar cell active light absorber material 104 include, but are not limited to: Si, Ge, III-V binary compounds, and metal chalcogenides. Suitable materials for the second solar cell active light absorber material 106 include, but are not limited to: $WS_2$, $ReS_2$, $WSe_2$, $MoS_2$, $SnS_2$ and III-V compounds. Here a metal chalcogenide is a binary compound AB$_x$ where 0.1<x<10 and where A is a metal and B is S (sulfur), Se (selenium) or Te (tellurium). III-V binary compounds are binary compounds AB where A is from group 3 (i.e., B, Al, Ga, In, Tl) and B is from group 5 (i.e., N, P, As, Sb and Bi). Suitable transparent electrically conductive materials for contact structures 114, 116, and 118 are known in the art, as are suitable transparent insulators for layer 132.

For simplicity, solar cell active light absorber materials are shown as single layer structures in the examples herein. However, various active material configurations are possible, such as: undoped or uniformly doped layer; p-n junction in a layer of a single material; p-i-n junction in a layer of a single material; and the 'active material' being two or more layers of different materials to form a heterojunction. Such heterojunctions can be from one metal chalcogenide to another metal chalcogenide, or from a metal chalcogenide to a non-chalcogenide, or from one non-chalcogenide to another non-chalcogenide.

Figure 2:
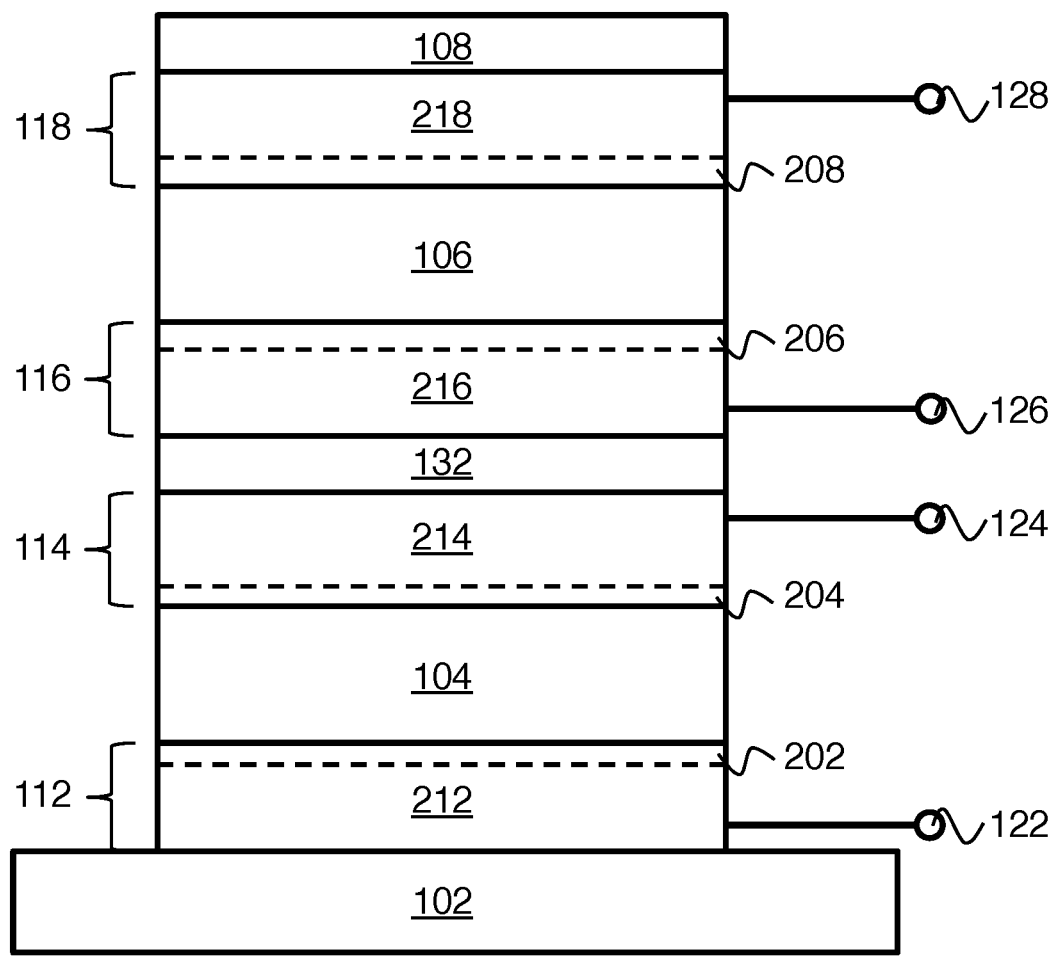
FIG. 2 shows a second embodiment of the invention.

Contact structures 112, 114, 116, 118 in the example of FIG. 1 can be single layer structures as shown on FIG. 1, or they can be multilayer structures as in the example of FIG. 2. On FIG. 2, contact structure 112 includes layers 212 and 202, contact structure 114 includes layers 214 and 204, contact structure 116 includes layers 216 and 206, and contact structure 118 includes layers 218 and 208. Here layers 212, 214, 216, 218 are electrically conductive and are connected to terminals 122, 124, 126, 128, respectively.

Layers 202, 204, 206, 208 can provide carrier-selective contacts to the solar cell active light absorber materials and/or they can provide doping of a metal chalcogenide solar cell active light absorber material by charge transfer. These two functions are described in greater detail below in sections B and C respectively.

More specifically, in a preferred embodiment at least one of the first solar cell contact structure 112 and the second solar cell contact structure 114 includes an interlayer structure (i.e., 202 and/or 204) that provides a carrier-selective contact to the first solar cell active light absorber material 104.

In another preferred embodiment at least one of the third solar cell contact structure 116 and the fourth solar cell contact structure 118 includes an interlayer structure (i.e., 206 and/or 208) that provides a carrier-selective contact to the second solar cell active light absorber material 106.

In yet another preferred embodiment, doping of the metal chalcogenide is provided by inclusion of one or more adjacent metal-oxide layers in one or more adjacent solar cell contact structures, where the metal-oxide layers are configured to provide doping of the metal chalcogenide by charge transfer. For example, if active material 106 is a metal chalcogenide it can be doped using layers 206 and/or 208, and if active material 104 is a metal chalcogenide it can be doped using layers 202 and/or 204. Here 'doping by charge transfer' refers to a situation where two adjacent layers A and B interact such that layer A provides doping of layer B by transfer of charge between the two layers, possibly due to difference in Fermi levels or chemical potentials of A and B. The source of charge can also be either fixed charges or defects present in A.

Although the example of FIG. 2 shows all four contact structures having this additional structure, this configuration is not required. Any one of the contact structures can have this additional structure. Similarly, any two of the contact structures can have this additional structure. Finally, any three of the contact structures can have this additional structure.

Figure 3:
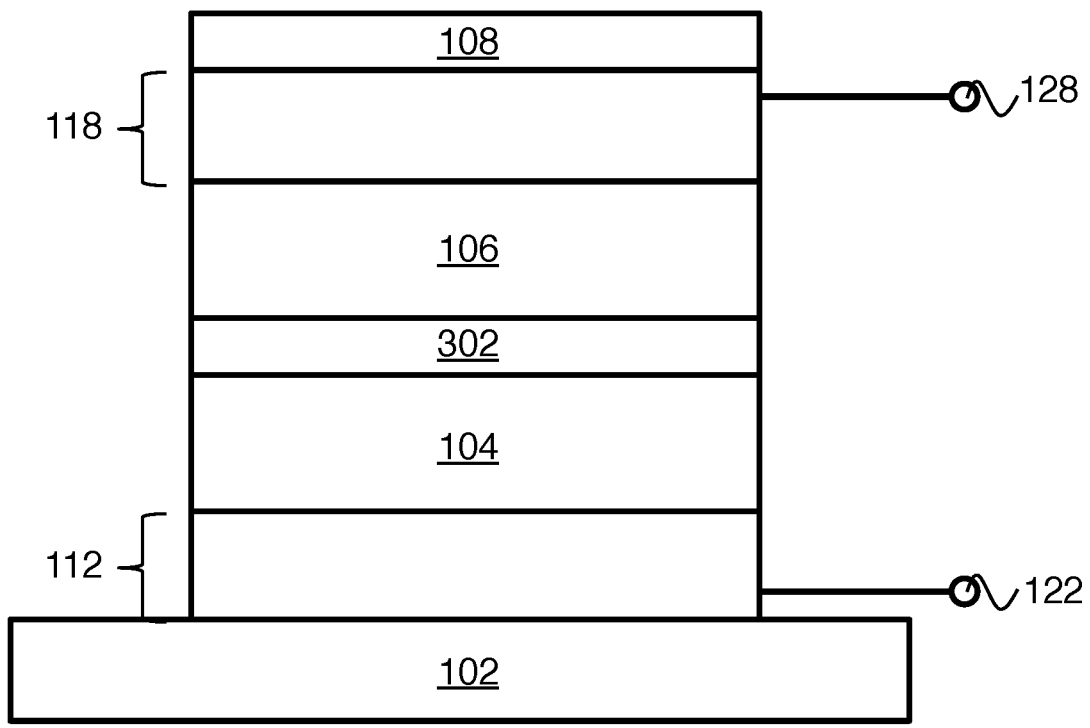
FIG. 3 shows a third embodiment of the invention.

FIG. 3 shows another embodiment of the invention. Here 102, 112, 104, 106, 118, 108, 122, and 128 are as described above in connection with FIG. 1. Contact structures 114 and 116, terminals 124 and 126 and insulating layer 132 of FIG. 1 are removed, and replaced by a tunnel junction structure 302. More specifically, tunnel junction structure 302 is disposed on the first solar cell active light absorber material 104. The second solar cell active light absorber material 106 is disposed on the tunnel junction structure 302. The tunnel junction structure 302 is transparent to the solar spectrum. The design and fabrication of such tunnel junction structures is known in the art. The resulting two-terminal structure is a vertical stack of two electrically coupled solar cells. In particular, the current through the two stacked solar cells must be the same.

Figure 4:
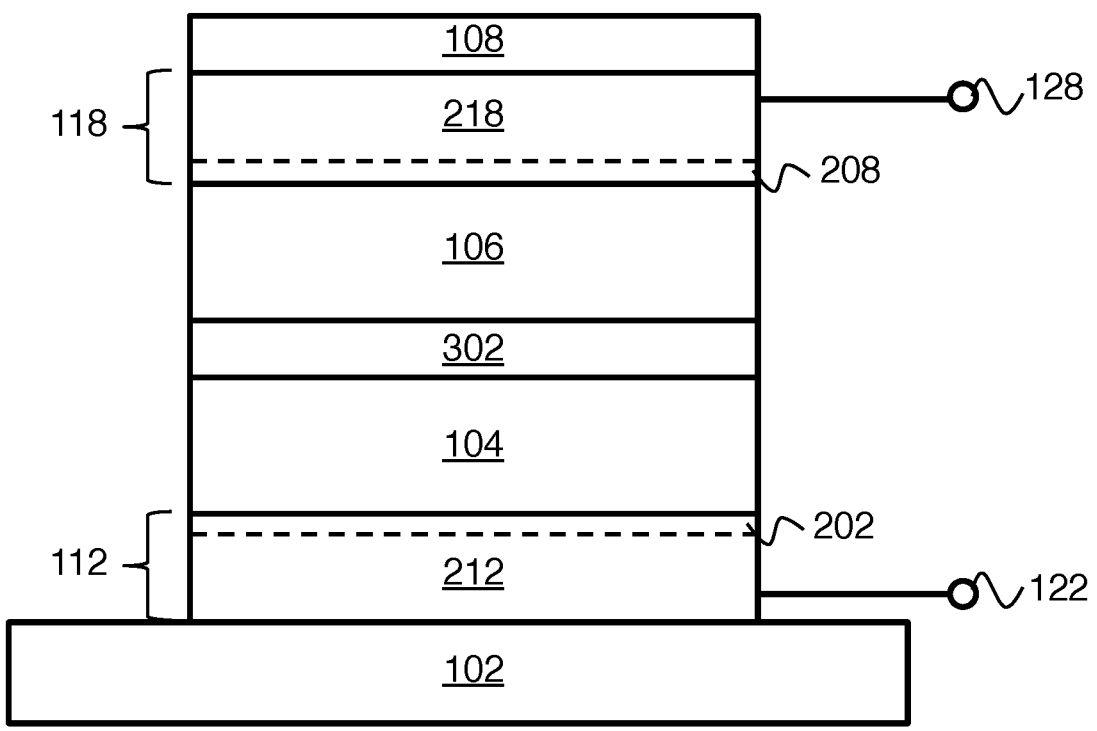
FIG. 4 shows a fourth embodiment of the invention.

The example of FIG. 4 is related to the example of FIG. 3 the same way the example of FIG. 2 is related to the example of FIG. 1. More specifically, contact structures 112 and 118 in the example of FIG. 3 can be single layer structures as shown on FIG. 3, or they can be multilayer structures as in the example of FIG. 4. On FIG. 4, contact structure 112 includes layers 212 and 202, and contact structure 118 includes layers 218 and 208. Here layers 212 and 218 are electrically conductive and are connected to terminals 122 and 128, respectively.

Layers 202 and 208 can provide carrier-selective contacts to the solar cell active light absorber materials 104 and 106 respectively and/or they can provide doping of a metal chalcogenide solar cell active light absorber material by charge transfer.

More specifically, in a preferred embodiment solar cell contact structure 112 includes an interlayer structure (i.e., 202) that provides a carrier-selective contact to the first solar cell active light absorber material 104.

In another preferred embodiment solar cell contact structure 118 includes an interlayer structure (i.e., 208) that provides a carrier-selective contact to the second solar cell active light absorber material 106.

In yet another preferred embodiment, doping of the metal chalcogenide is provided by inclusion of one or more adjacent metal-oxide layers in one or more adjacent solar cell contact structures, where the metal-oxide layers are configured to provide doping of the metal chalcogenide by charge transfer. For example, if active material 106 is a metal chalcogenide it can be doped using layer 208, and if active material 104 is a metal chalcogenide it can be doped using layer 202.

Although the example of FIG. 4 shows contact structures 112 and 118 both having this additional structure, this configuration is not required. Any one of the contact structures can have this additional structure.

B) Carrier-Selective Contacts

Figure 5A:
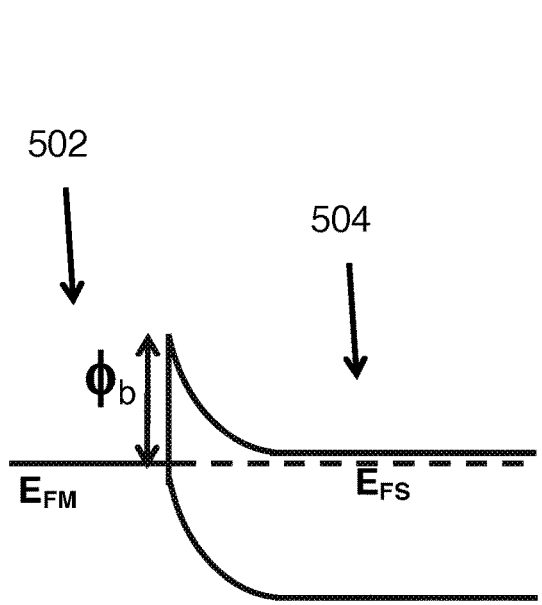
FIGS. 5A-C schematically show Fermi level pinning and electron and hole selective contacts.

As indicated above, carrier-selective contacts are an important feature of some preferred embodiments. To better appreciate this aspect of the present invention, it is helpful to review the band structure of a typical metal-semiconductor interface as shown on FIG. 5A. Here 502 shows the metal band structure and 504 shows the semiconductor band structure. This example shows Fermi level pinning at the metal-semiconductor interface leading to a relatively large Schottky barrier $\phi_b$. Fermi level pinning is also seen in metal chalcogenides.

A somewhat more detailed account of Fermi level pinning follows. In Metal-Semiconductor (MS) contacts the metal Fermi level is pinned at the charge neutrality level of the semiconductor, $E_{CNL}$, resulting in fixed electron and hole Schottky barrier heights. Wave function of electrons from the metal penetrate into the semiconductor, giving rise to metal induced gap states (MIGS). These states are strictly confined to the interface. The charge neutrality level, $E_{CNL}$, is the energy level at which the MIGS change from mostly donor like to acceptor like. Charging of the MIGS by the metal wave function creates a dipole charge causing the metal Fermi level $E_{FM}$ to align to minimize the dipole charge towards zero, effectively pulling the $E_{FM}$ at the interface towards $E_{CNL}$. The metal Fermi level pins due to MIGS irrespective of its work function, giving a fixed Schottky barrier height at the interface. As an example, in Si the Fermi level pins about a third of the bandgap above the valance band, while in Ge it pins near the valance band, and in $MoS_2$ it pins near the conduction band.

Figure 5B:
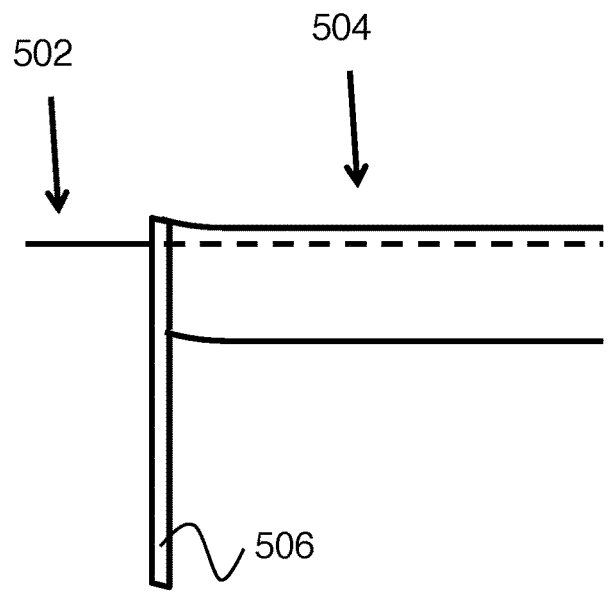
Figure 5C:
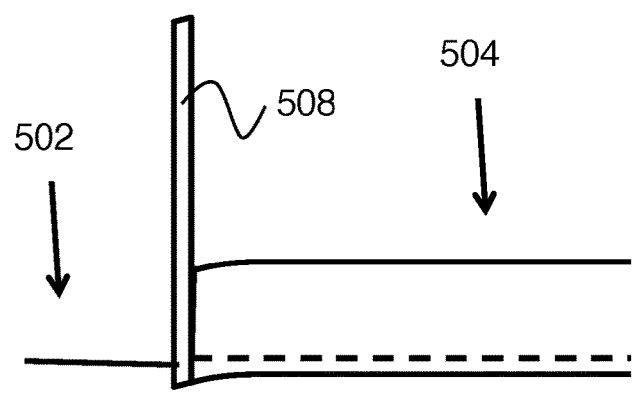

The Metal-Interlayer-Semiconductor (MIS) contact shown in FIG. 5B serves as an electron selective contact where there is little or no barrier to electrons due to zero/negligible conduction band offset yet a large barrier to holes. An interlayer 506 provides this desirable band configuration, as described below. The MIS contact shown in FIG. 5C serves as a hole selective contact where there is little or no barrier to holes due to zero/negligible valence band offset yet a large barrier to electrons. An interlayer 508 provides this desirable band configuration, as described below. These two contact schemes provide unimpeded collection of one type of carriers and reflection of the other type of carriers due to a large band offset. Besides providing selectivity, the metal Fermi level is repinned near the conduction band edge (FIG. 5B) or the valence band edge (FIG. 5C).

The main concept behind these MIS contacts is that an ultrathin interlayer when inserted into the metal/semiconductor interface can block the penetration of the metal wave function into the semiconductor and equivalently reduce the metal induced gap state (MIGS) density. An additional dipole is formed at the interlayer/semiconductor interface. As a result, Fermi level pinning at the metal/semiconductor Schottky junction is released and the Schottky barrier height comes to be determined by the metal work function (as opposed to being mostly independent of metal composition). When the Schottky barrier is unpinned, the barrier height can be changed by changing to a metal with a different work function.

Note that 'MIS' here is for convenience of description. In particular, 'M' is not to be strictly interpreted as referring only to a metal. Instead it can be any electrically conductive material, such as the transparent conductors considered above.

Here we define an electron-selective contact or interface as having an energy barrier of 0.3 eV or less for electrons and an energy barrier of 1.0 eV or greater for holes. Similarly a hole-selective contact or interface has an energy barrier of 0.3 eV or less for holes and an energy barrier of 1.0 eV or greater for electrons. Preferably all contacts and interfaces have a Schottky barrier height or interface band bending of 0.3 eV or less. Here we define the Schottky barrier as being the equilibrium band bending in the semiconductor as a result of the presence of the MI structure at the semiconductor surface. We have found that such small Schottky barriers can be achieved by choosing the metal and interlayer compositions such that the combined effect of the metal work function and the metal-interlayer Fermi level pinning provides the desired results. The bottom line is that the undesirable effects of metal-semiconductor Fermi level pinning are avoided.

Figure 6:
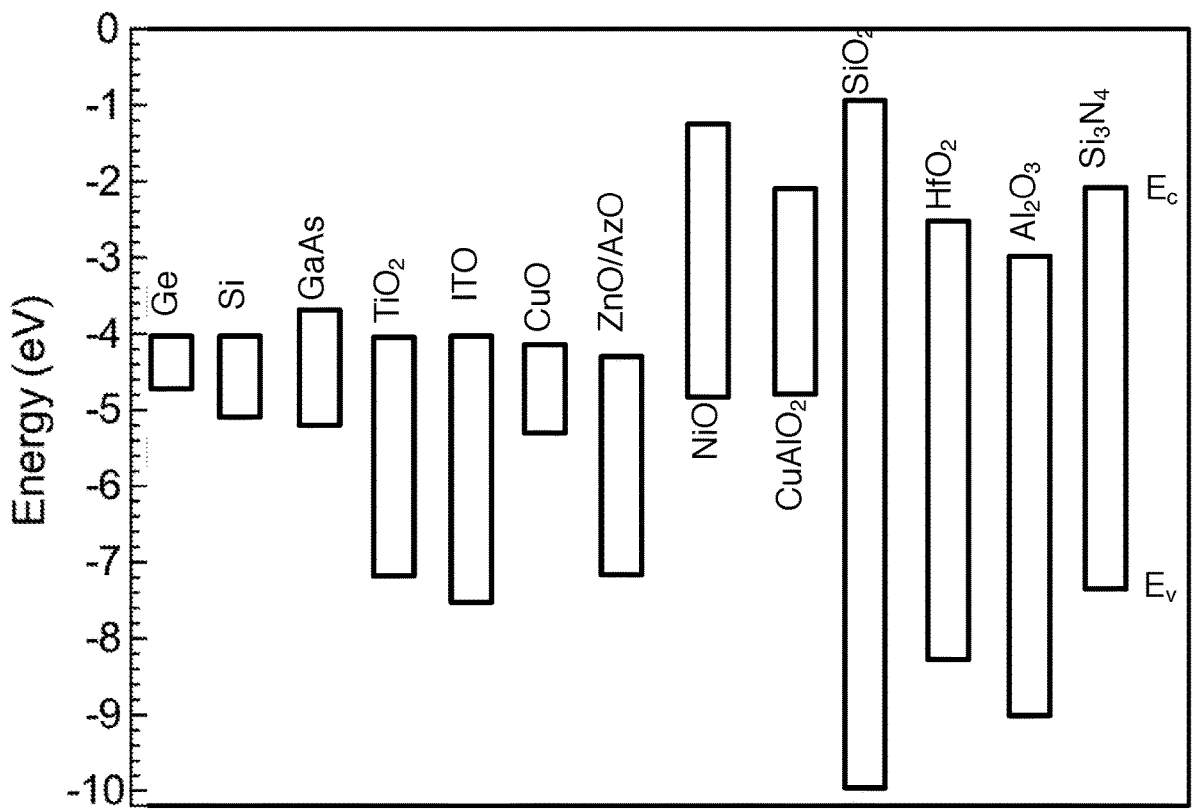
FIGS. 6-8 present literature data on band gaps and band alignment of several relevant materials.
Figures 7, 8:
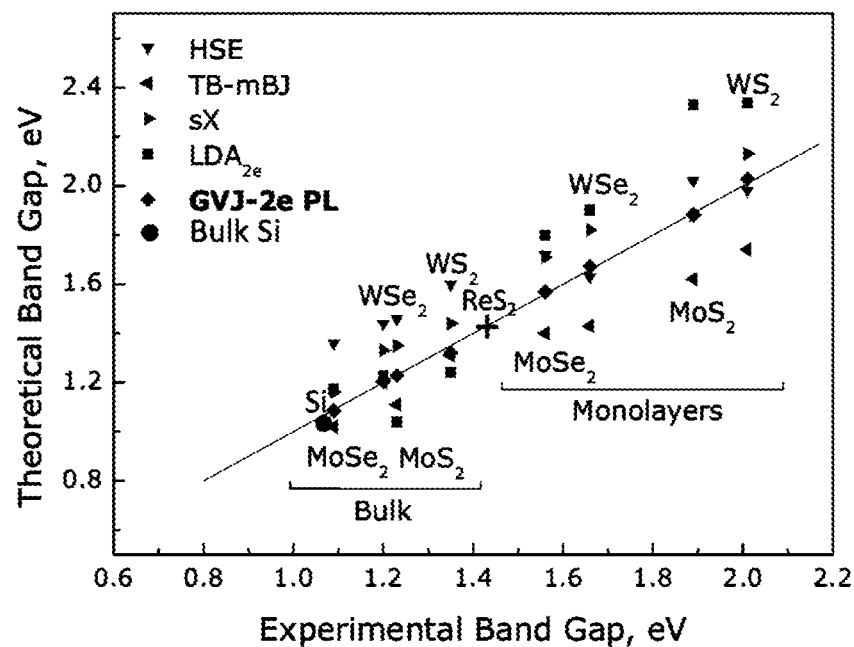

The band lineup for several different interlayers along with various semiconductors including Si, Ge and GaAs and several metal chalcogenides is known from the literature and is shown on FIGS. 6-8. $WSe_2$—$WO_3$ and $WS_2$—$MoO_3$ are two examples of suitable metal chalcogenide-interlayer pairs. The table of FIG. 8 (from the literature) gives many of the properties of several bulk metal chalcogenides, such as band gap, experimental optical band gap, ionization potential (IP, valence band energy), electron affinity (EA, conduction band energy), and charge neutrality level.

C) Doping by Charge Transfer to Metal Chalcogenides

Figure 9A:
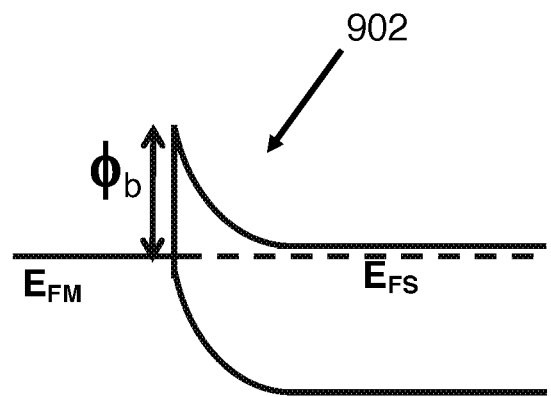
FIGS. 9A-B schematically show Schottky and p-n junctions.
Figure 9B:
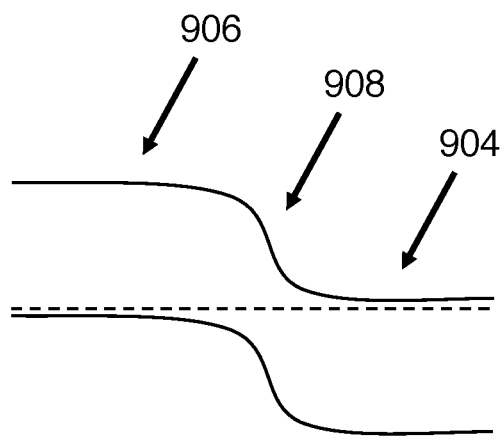

As indicated above, doping of metal chalcogenides is an important feature of some preferred embodiments. To better appreciate this aspect of the invention, it is helpful to note that doping is optional in the solar cells of this work. For example, it is possible to obtain solar cell action when the solar cell active light absorber material is configured to provide a Schottky junction as in the example of FIG. 9A. Here 902 is the Schottky barrier, and illumination of the structure will lead to charge generation, separation and solar cell action. Another way to obtain solar cell action in undoped structures is to use electron-selective and hole-selective contacts as described above. Here, illumination of the structure will lead to electron and hole generation and solar cell action because the difference in Fermi levels of the two contact structures of the carrier-selective contacts will provide charge separation and collection. A third way to obtain solar cell action in semiconductor structures is doping as shown on FIG. 9B. Here 904 is an n-type region, 906 is a p-type region, and 908 is the p-n junction between regions 904 and 906. Here, illumination of the structure will lead to charge generation, separation and solar cell action.

Accordingly, some preferred embodiments are designed such that at least one of the first solar cell active light absorber material and the second solar cell active light absorber material is doped to provide a p-n junction. In other preferred embodiments, at least one of the first solar cell active light absorber material and the second solar cell active light absorber material is configured to provide a Schottky junction. In cases where p-n junctions are formed, any doping method can be used, such as diffusion doping, implant doping or charge transfer doping.

D) Experimental Results

This section presents experimental results for selective contacts to metal chalcogenides and for doping of metal chalcogenides.

Figure 10A:
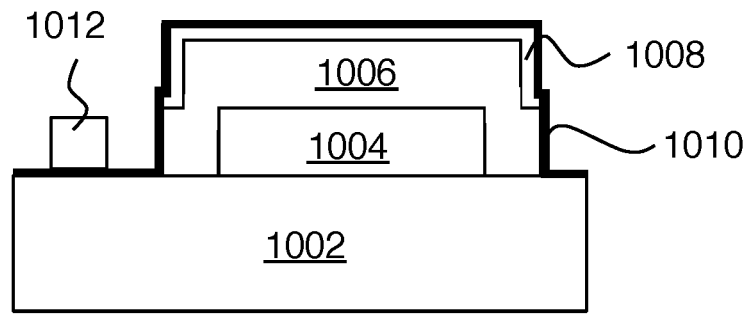
FIGS. 10A-B show results from a first experiment relating to carrier-selective contacts.
Figure 10B:
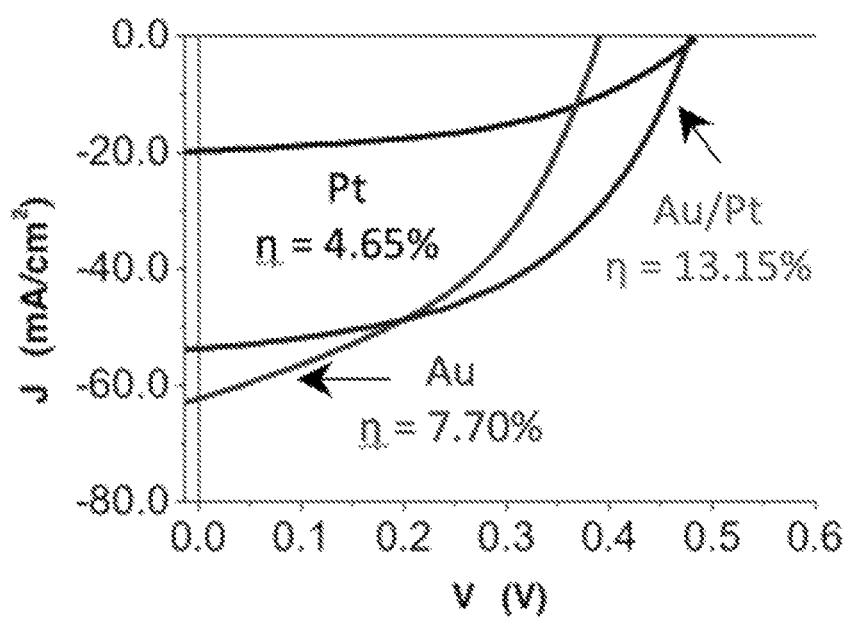

FIGS. 10A-B relate to use of an MIS contact to a metal chalcogenide. FIG. 10A shows the experimental structure. Here 1002 is an $SiO_2$ substrate, 1004 is the bottom contact, 1006 is a $WSe_2$ etched flake, 1008 is a $WO_x$ interlayer, 1010 is a graphene layer, and 1012 is a Ti contact. Thus the MIS structure here is graphene-$WO_x$—$WSe_2$.

FIG. 10B shows I-V measurements under AM 1.5G radiation for three different bottom contact configurations (20 nm Pt, 50 nm Au, 50/5 nm Au/Pt). This shows a record high efficiency of 13.15% in solid transition metal dichalcogenide solar cells using Metal-Interlayer-Semiconductor (MIS) contacts with $WO_x$ as the interlayer.

Figure 11A:
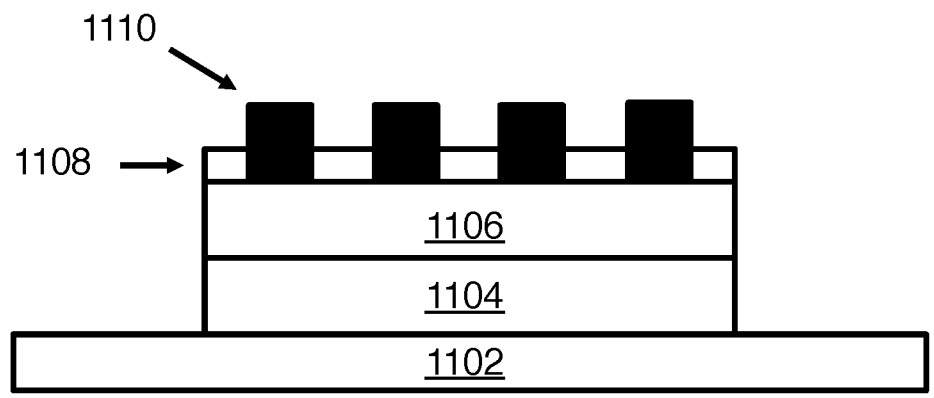
FIGS. 11A-B show results from a second experiment relating to doping by charge transfer.
Figure 11B:
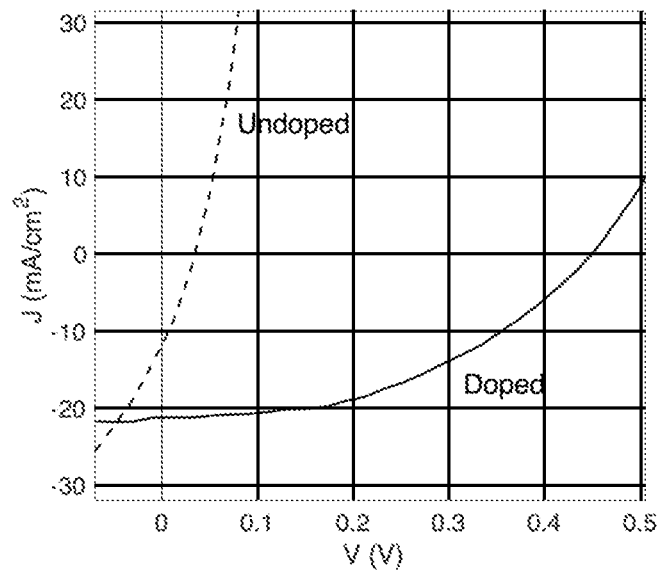

FIGS. 11A-B relate to charge transfer doping of a metal chalcogenide. FIG. 11A shows the experimental structure. Here 1102 is the $SiO_2$ substrate, 1104 is the bottom contact (Au), 1106 is the metal chalcogenide active material ($WS_2$), 1108 is the doping layer $MoO_x$ and 1110 is the top contact (Al).

FIG. 11B shows I-V measurements under AM 1.5G radiation. This shows a record high efficiency of 4.20% in $WS_2$ homojunction solar cells achieved by charge transfer doping using $MoO_x$.

The invention claimed is:

1. A tandem solar cell comprising:
a substrate;
a first solar cell contact structure disposed on the substrate;
a first solar cell active light absorber material disposed on the first solar cell contact structure and having a first band gap E1;
a second solar cell contact structure disposed on the first solar cell active light absorber material, wherein the second solar cell contact structure is transparent to the solar spectrum;
an insulator layer disposed on the second solar cell contact structure, wherein the insulator layer is transparent to the solar spectrum;
a third solar cell contact structure disposed on the transparent insulating layer, wherein the third solar cell contact structure is transparent to the solar spectrum;
a second solar cell active light absorber material disposed on the third solar cell contact structure and having a second band gap E2;
a fourth solar cell contact structure disposed on the second solar cell active light absorber material, wherein the fourth solar cell contact structure is transparent to the solar spectrum;
wherein at least one of the first solar cell active light absorber material and the second solar cell active light absorber material is a metal chalcogenide;
wherein E2>E1;
wherein at least one of the first solar cell active light absorber material and the second solar cell active light absorber material is doped to provide a p-n junction;
wherein doping of the metal chalcogenide is provided by inclusion of one or more adjacent metal-oxide layers in one or more adjacent solar cell contact structures, wherein the metal-oxide layers are configured to provide doping of the metal chalcogenide by charge transfer.

2. The tandem solar cell of claim 1, wherein the first solar cell active light absorber material is selected from the group consisting of: Si, Ge, III-V binary compounds, and metal chalcogenides.

3. The tandem solar cell of claim 1, wherein the second solar cell active light absorber material is selected from the group consisting of: $WS_2$, $ReS_2$, $WSe_2$, $MoS_2$, $SnS_2$ and III-V compounds.

4. The tandem solar cell of claim 1, wherein at least one of the first solar cell contact structure and the second solar cell contact structure includes an interlayer structure that provides a carrier-selective contact to the first solar cell active light absorber material.

5. The tandem solar cell of claim 1, wherein at least one of the third solar cell contact structure and the fourth solar cell contact structure includes an interlayer structure that provides a carrier-selective contact to the second solar cell active light absorber material.

6. The tandem solar cell of claim 1, wherein at least one of the first solar cell active light absorber material and the second solar cell active light absorber material is configured to provide a Schottky junction.

7. A tandem solar cell comprising:
a substrate;
a first solar cell contact structure disposed on the substrate;
a first solar cell active light absorber material disposed on the first solar cell contact structure and having a first band gap E1;
a tunnel junction structure disposed on the first solar cell active light absorber material, wherein the tunnel junction structure is transparent to the solar spectrum;
a second solar cell active light absorber material disposed on the tunnel junction structure and having a second band gap E2;
a second solar cell contact structure disposed on the second solar cell active light absorber material, wherein the second solar cell contact structure is transparent to the solar spectrum;
wherein at least one of the first solar cell active light absorber material and the second solar cell active light absorber material is a metal chalcogenide;
wherein E2>E1;
wherein at least one of the first solar cell active light absorber material and the second solar cell active light absorber material is doped to provide a p-n junction;
wherein doping of the metal chalcogenide is provided by inclusion of an adjacent metal-oxide layer in an adjacent solar cell contact structure, wherein the metal-oxide layer is configured to provide doping of the second solar cell active light absorber material by charge transfer.

8. The tandem solar cell of claim 7, wherein the first solar cell active light absorber material is selected from the group consisting of: Si, Ge, III-V binary compounds, and metal chalcogenides.

9. The tandem solar cell of claim 7, wherein the second solar cell active light absorber material is selected from the group consisting of: $WS_2$, $ReS_2$, $WSe_2$, $MoS_2$, $SnS_2$ and III-V compounds.

10. The tandem solar cell of claim 7, wherein the first solar cell contact structure includes an interlayer structure that provides a carrier-selective contact to the first solar cell active light absorber material.

11. The tandem solar cell of claim 7, wherein the second solar cell contact structure includes an interlayer structure that provides a carrier-selective contact to the second solar cell active light absorber material.

12. The tandem solar cell of claim 7, wherein at least one of the first solar cell active light absorber material and the second solar cell active light absorber material is configured to provide a Schottky junction.

* * * * *